(12) United States Patent
Nishikawa et al.

(10) Patent No.: US 8,924,180 B2
(45) Date of Patent: Dec. 30, 2014

(54) MAINTENANCE SYSTEM AND MAINTENANCE METHOD

(75) Inventors: Takeichiro Nishikawa, Kanagawa-ken (JP); Minoru Nakatsugawa, Kanagawa-ken (JP); Ryusei Shingaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 960 days.

(21) Appl. No.: 13/048,697

(22) Filed: Mar. 15, 2011

(65) Prior Publication Data

US 2012/0065933 A1      Mar. 15, 2012

(30) Foreign Application Priority Data

Sep. 10, 2010   (JP) ................... P2010-203611

(51) Int. Cl.
  *G01R 31/3183*    (2006.01)
(52) U.S. Cl.
  CPC ... *G01R 31/318371* (2013.01); *G01R 31/318385* (2013.01)
  USPC ........................................................ 702/181
(58) Field of Classification Search
  CPC ............................................. G01R 31/318371
  USPC ........................................................ 702/181
  See application file for complete search history.

(56) References Cited

U.S. PATENT DOCUMENTS 5,018,069 A  *  5/1991  Pettigrew ..................... 701/31.6
6,473,677 B1     10/2002 Hershey et al.

FOREIGN PATENT DOCUMENTS

| JP | 6-168154   | 6/1994  |
| JP | 10-040124  | 2/1998  |
| JP | 10-301799  | 11/1998 |
| JP | 2008-9842  | 1/2008  |
| JP | 2008-158628 | 7/2008 |
| JP | 2008-217265 | 9/2008 |

* cited by examiner

*Primary Examiner* — Bryan Bui
(74) *Attorney, Agent, or Firm* — Finnegan, Henderson, Farabow, Garrett & Dunner, L.L.P.

(57) ABSTRACT

According to one embodiment, a measurement unit periodically measures a usage status of a measurement target, and measures each test item of the measurement target at an arbitrary timing according to a test schedule. A first storage unit stores the usage status and a test result in time series. A second storage unit stores statistic information representing a relationship between the usage status and the test result. A probability calculation unit calculates a first evaluation value representing a load of the measurement target at a recent timing and a second evaluation value representing a load of the measurement target at the arbitrary timing, based on the usage status, and calculates a specific probability of each test item, based on the statistic information, the first evaluation value and the second evaluation value. A test schedule creation unit creates a new test schedule having selected test items, based on the specific probability.

10 Claims, 13 Drawing Sheets

MAINTENANCE SYSTEM AND MAINTENANCE METHOD

CROSS-REFERENCE TO RELATED APPLICATION

This application is based upon and claims the benefit of priority from Japanese Patent Application No. 2010-203611, filed on Sep. 10, 2010; the entire contents of which are incorporated herein by reference.

FIELD

Embodiments described herein relate generally to a maintenance system and a maintenance method.

BACKGROUND

In case of maintaining a device, a diagnostics needs to be executed according to a test schedule to detect a status of the device. For example, this technique is disclosed in JP-A H10-40124 (Kokai). However, a load often occurs to the device by the diagnostics itself, and degradation of the device is caused by the load. Accordingly, it is necessary to create a test schedule able to effectively diagnose.

DETAILED DESCRIPTION

According to one embodiment, a maintenance system includes a plurality of measurement targets, a measurement unit, a first storage unit, a second storage unit, a probability calculation unit, and a test schedule creation unit. The measurement unit is configured to periodically measure a usage status of a measurement target, and to measure a test item of the measurement target at an arbitrary timing according to a test schedule having a plurality of test items. Measured data of the test item is a test result. The first storage unit is configured to store the usage status and the test result in time series. The second storage unit is configured to store statistic information representing a relationship between the usage status and the test result. The probability calculation unit is configured to calculate a first evaluation value representing a load of the measurement target at a recent timing and a second evaluation value representing a load of the measurement target at the arbitrary timing, based on the usage status stored in the first storage unit, and to calculate a specific probability of each test item, based on the statistic information, the first evaluation value and the second evaluation value. The test schedule creation unit is configured to create a new test schedule by selecting from the plurality of test items, based on the specific probability.

Various embodiments will be described hereinafter with reference to the accompanying drawings.

The First Embodiment

Figure 1:
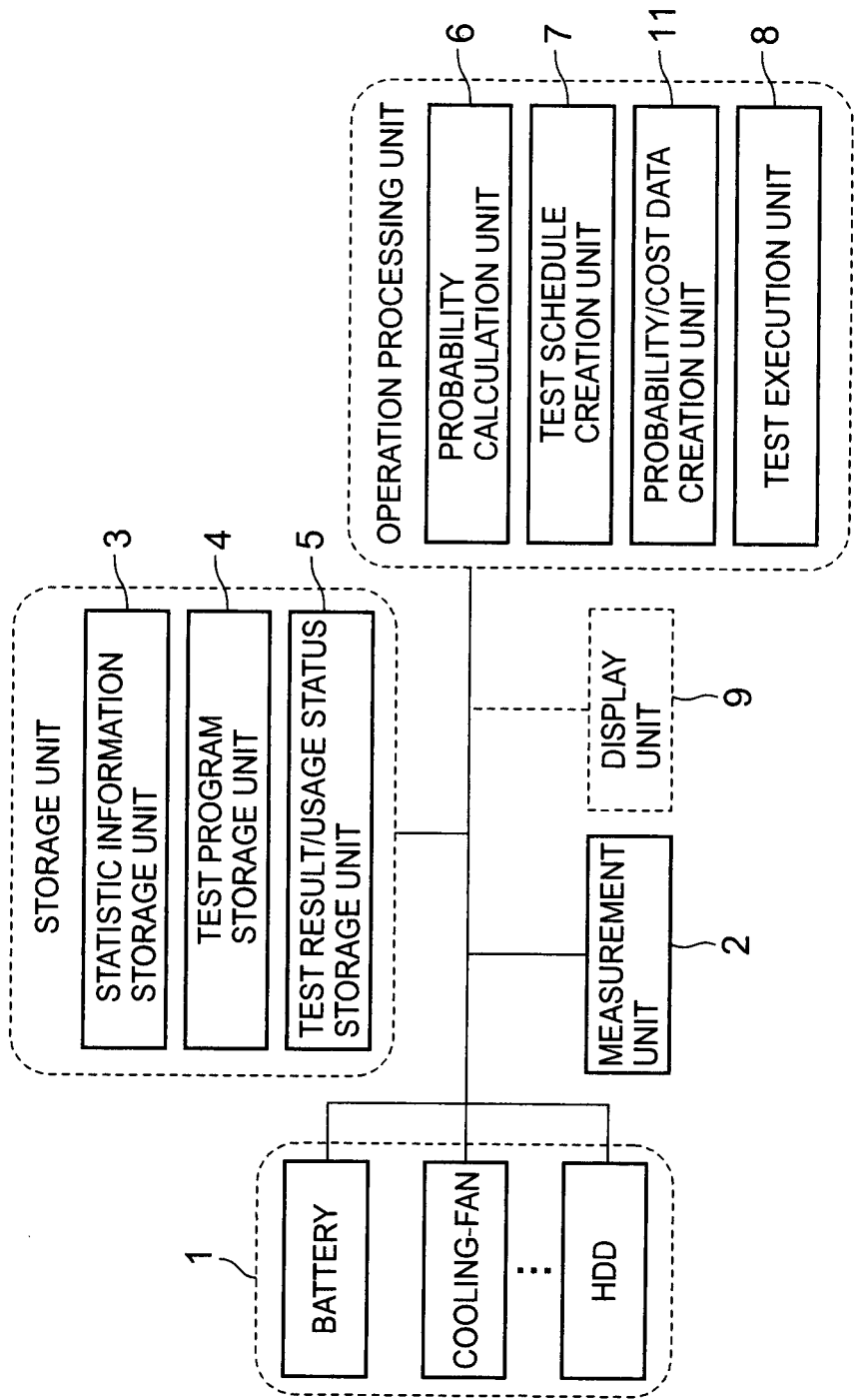
FIG. 1 is a block diagram of a maintenance system according to a first embodiment.

FIG. 1 is a component of a maintenance system according to the first embodiment. In the first embodiment, an electronic device (For example, a computer) has a self-diagnostics function, and an operation apparatus installed into the electronic device executes maintenance by diagnosing its component elements (For example, a buttery). As to this diagnostics, if a diagnostics object is a buttery, for example, a buttery-capacity is measured. Hereinafter, content of the diagnostics is called "a test item", and combination of test items is called "a test schedule".

As shown in FIG. 1, the maintenance system includes a measurement target 1 as a diagnostics object (such as a battery), a measurement unit 2 to measure data (a usage status and a test result) from the measurement target 1, a storage unit to store a test program and measured data, and an operation processing unit to control each unit.

In the first embodiment, the storage unit includes a statistic information storage unit 3, a test program storage unit 4, and a test result/usage status storage unit 5. For example, these storage units can be realized as a storage device such as a memory or a HDD.

The operation processing unit includes a probability calculation unit 6, a test schedule creation unit 7, and a test execution unit 8. These functions can be realized as a program module operated by a CPU. Furthermore, if necessary, the maintenance system includes a display unit 9 such as a display device.

Figure 2:
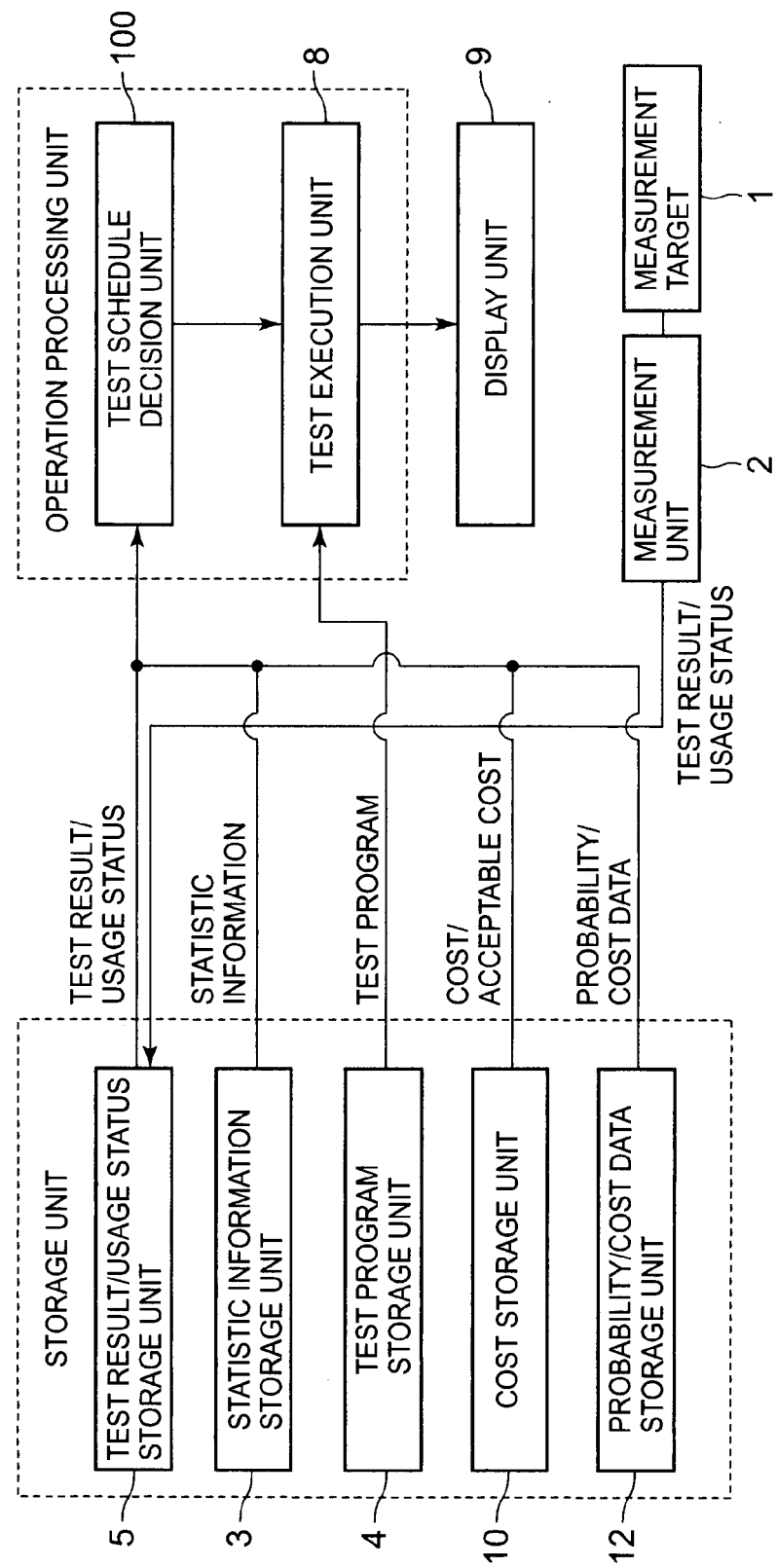
FIG. 2 is a block diagram of a main part of the maintenance system in FIG. 1.

Hereinafter, processing of the maintenance system is explained by referring to FIGS. 2~8. FIG. 2 is a block diagram of a main part of the maintenance system.

The measurement target 1 represents each element (For example, a battery, a cooling-fan, a HDD) composing a device. In this case, above-mentioned CPU and memory may be included. In the first embodiment, these measurement targets 1 are regarded as a diagnostics object.

The measurement 2 periodically measures a usage status of the measurement target 1, different from diagnostics timing of the device. For example, as shown in table 1, the usage status is a CPU operation time or an accumulated time of power-ON. Briefly, the usage status is a measurement item (such as a usage quantity, a usage frequency, an accumulated usage quantity) of the measurement target measured by the measurement unit 2. As the usage status, an item of which measurement value more increases in proportion to usage of the device is previously given. As mentioned-above, the usage status (measured/acquired by the measurement unit 2) is stored into the test result/usage status storage unit 5 in time series as usage status data (table 1). This usage status data are arbitrarily updated when the measurement unit 2 newly measures the usage status.

Furthermore, when the device is diagnosed at an arbitrary timing (timing indicated by a user, or periodically), the measurement unit 2 measures each test item according to a test schedule, controlled by the test execution unit 8. As shown in table 2, the test item represents an operation test (such as a tip test of CPU, a memory-speed) of the measurement target 1, each of which is numbered. The test result is output as binary (OK, NG) or multiple values. As mentioned-above, the test result (measured/acquired by the measurement unit 2) is stored into the test result/usage status storage unit 5 in time series as test result data (table 2). This test result data is arbitrarily updated when the measurement unit 2 newly measures the test item.

The statistic information storage unit 3 stores statistic information of each test item. The statistic information represents information to statistically process relationship between the usage status and the test result, and information acquired by the processing. Concretely, among the usage status, one affecting each test item is called "a parameter", and a monotonous function connected with the parameter is called "an evaluation value". In this case, a definition of the evaluation value and a statistic curve to estimate the test result from the evaluation value are called "statistic information". By multiplying coefficients with the parameter, the parameter is arbitrarily weighted. Furthermore, the evaluation value is not limited to above-mentioned definition. For example, the evaluation value may be one to evaluate a load of the measurement target 1 for each test item or one to evaluate degradation of the measurement target 1 caused by the load.

In above explanation, as a measurement value of the usage status, an item of which data more increases in proportion to usage of the device is defined. However, an item of which data more decreases in proportion to usage of the device may be defined.

As an example of the parameter, in case of CPU-tip test to check whether CPU is normally operating, in usage status of table 1, accumulated time of power-ON and CPU operation time affect the test item of CPU-tip test. Accordingly, these usage statuses are regarded as the parameter.

In case of the test result having multiple values, statistic information further includes a correspondence table (table 3) representing relationship between a difference of measurement values and a probability of failure (explained afterwards). Moreover, as to the first embodiment, statistic information is acquired by collecting data from a plurality of devices and previously stored into the statistic information storage unit 3. However, in the device, after statistic information is created from usage status data and test result data stored into the test result/usage status storage unit 5, the statistic information may be stored into the statistic information storage unit 3.

As an example, in case of CPU-tip test, by setting the accumulated time of power-ON and the CPU operation time as parameters, following definition of evaluation value is acquired. In an equation (1), coefficients "0.7 and 1.2" multiplied with each usage status are used for weighting.

(evaluation value)=0.7×(accumulated time of power-ON)+1.2×(CPU operation time) (1)

From statistic information (stored in the statistic information storage unit 3) and usage status data/test result data (stored in the test result/usage status storage unit 5), the test schedule creation unit 7 creates a new test schedule. Concrete operation of the test schedule creation unit 7 is explained.

Figure 3:
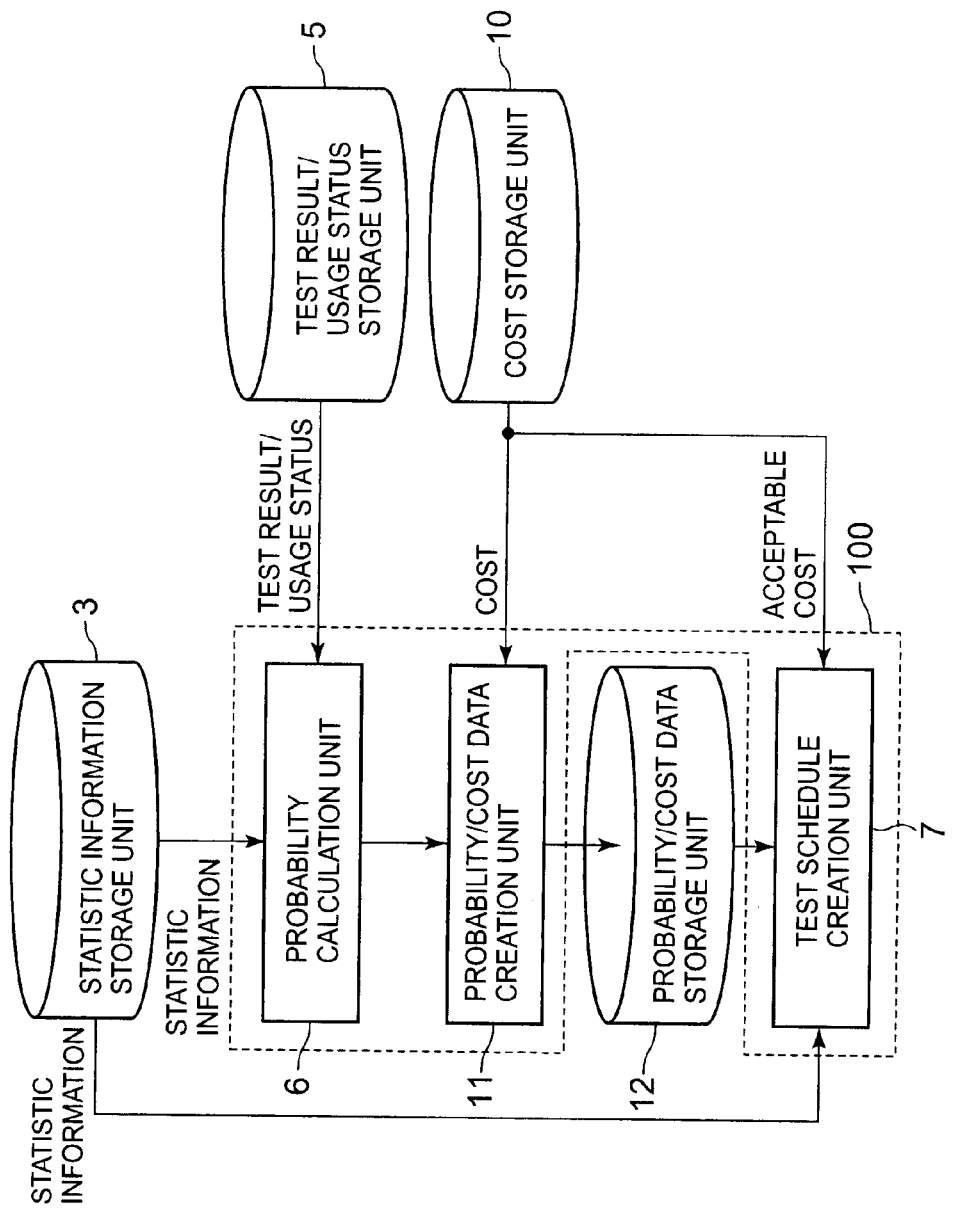
FIG. 3 is a block diagram of a test schedule decision unit in FIG. 2.

FIG. 3 is a block diagram of a test schedule decision unit 100 including the test schedule creation unit 7.

First, the probability calculation unit 6 calculates a probability of failure of each test item from the statistic information, the usage status and the test result. In this case, processing in case of the test result having binary is different from processing in case of the test result having multiple values. Accordingly, processing of two cases is respectively explained by referring to flow charts.

Figure 4:
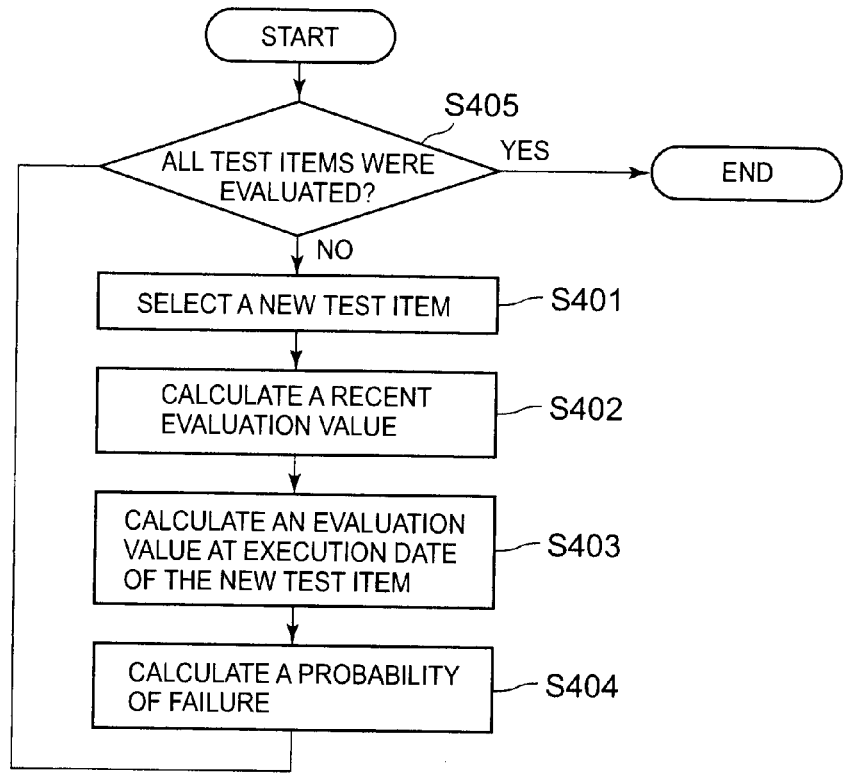
FIG. 4 is a flow chart to calculate a probability of failure in case of a test result having binary.

FIG. 4 is a flow chart to calculate probability of failure in case of the test result having binary. First, when a test item is selected in order of test number (S401), definition of evaluation value corresponding to the test item is acquired. In this case, assume that CPU-tip test is selected and the equation (1) is acquired as the definition of evaluation value.

At S402, by above-mentioned definition of evaluation value, a recent evaluation value is calculated using recent usage status data. The recent usage status data represents, among usage status data in time series shown in table 1, data at the most recent date (2010/3/12 in table 1) when the test item is not checked. In this case, the accumulated time of power-ON is 55.56 (hour) and the CPU operation time is 5.5 (hour). By substituting these data for the equation (1), the recent evaluation value is calculated as 45.492.

At S403, by referring to table 2 which stores test results in time series, an execution date when the test item is checked is extracted. By using usable status data corresponding to the execution date, an evaluation value at the execution date (Hereinafter, it is called "a previous test timing") is calculated. In test result data of table 2, the execution data of CPU-tip test is 2010/3/9. Accordingly, the accumulated time of power-ON and the CPU operation time are referred at 2010/3/9 in table 1. In this case, the accumulated time of power-ON is 51.01 (hour) and the CPU operation time is 5.1 (hour). By substituting these data for the equation (1), an evaluation value at the previous test timing is calculated as 41.827.

If usage status data corresponding to the execution date (previous test timing) does not exist in table 1, by using usage status data corresponding to a nearest date before or after the execution data, the evaluation value at the previous test timing can be calculated. Furthermore, by measuring usable status data at an execution date of test item certainly or by measuring usable status every day, a status that usable status data corresponding to the execution date of test item does not exist can be prevented.

Moreover, in above explanation, the evaluation value at the previous test timing is calculated. However, an evaluation value at past test timing may be calculated for the purpose of comparison with the recent evaluation value.

At S404, by using a statistic curve (FIG. 5) of statistic information, the recent evaluation value, and the evaluation value at the previous test timing, a probability of failure is calculated. Concretely, in FIG. 5, as to a survival probability "0.799" corresponding to the evaluation value at the previous test timing and a survival probability "0.783" corresponding to the recent evaluation value, a difference "0.016" is calculated as the probability of failure at the present time. In this case, the survival probability represents a probability to pass the test for some evaluation value. Briefly, decreased value of the survival probability in case of increasing the evaluation value is defined as the probability of failure. When the probability of failure of all test items is calculated, processing is completed (S405).

Figure 6:
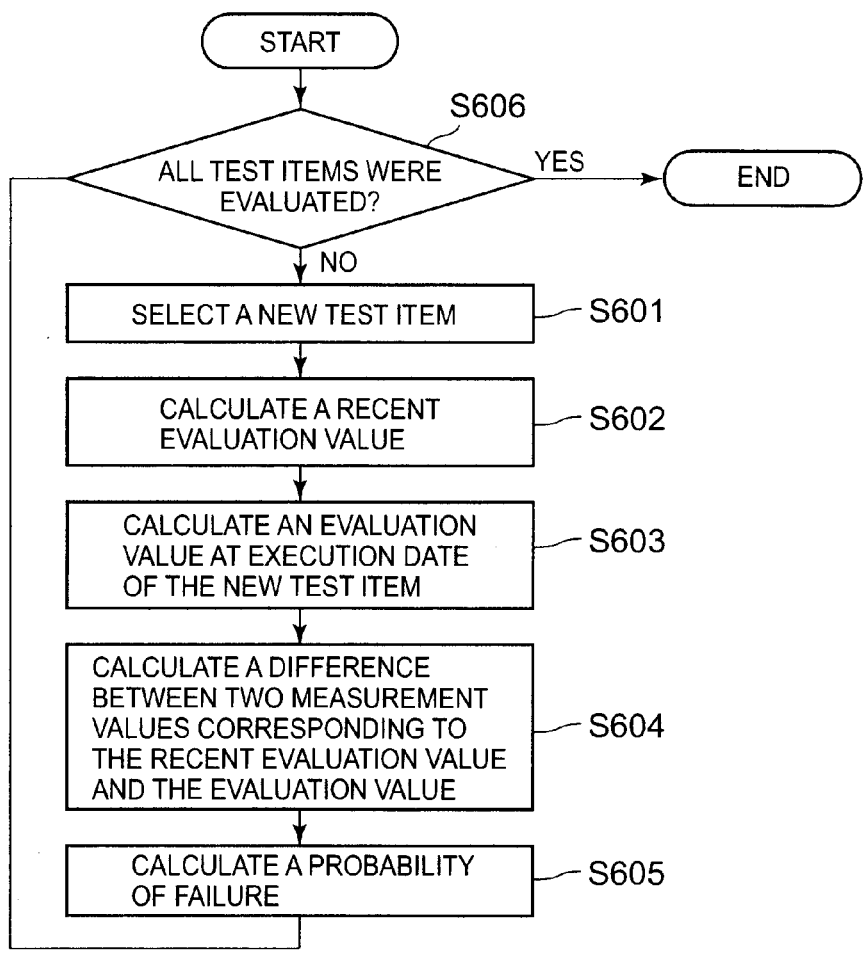
FIG. 6 is a flow chart to calculate a probability of failure in case of a test result having multiple values.

FIG. 6 is a flow chart to calculate probability of failure in case of the test result having multiple values. First, when a test item is selected in order of test number (S601), in the same way as the case of the test result having binary, a recent evaluation value and an evaluation value at a previous test timing are calculated according to a definition of an evaluation value corresponding to the test item (S602, S603). In this case, the previous test timing may be past test timing.

For example, the case of selecting a memory-speed as a test item is explained. In table 1, an accumulated time of high temperature and a write quantity of data are parameters affecting this test item. Accordingly, a following equation of evaluation value is assumed.

$$\text{(evaluation value)}=0.9\times\text{(accumulated time of high temperature)}+1.5\times\text{(write quantity of data)} \quad (2)$$

At a recent date (2010/3/12) in table 1, the accumulated time of high temperature is 9.9 (hour) and the write quantity of data is 36 (GB). By substituting these data for the equation (2), the recent evaluation value is calculated as 62.91. Furthermore, in table 2, a test date of the memory-speed is 2010/3/9. At this date, the accumulated time of high temperature is 9.8 (hour), and the write quantity of data is 32.2 (GB). By substituting these data for the equation (2), an evaluation value at the previous test timing is calculated as 62.82.

Figure 7:
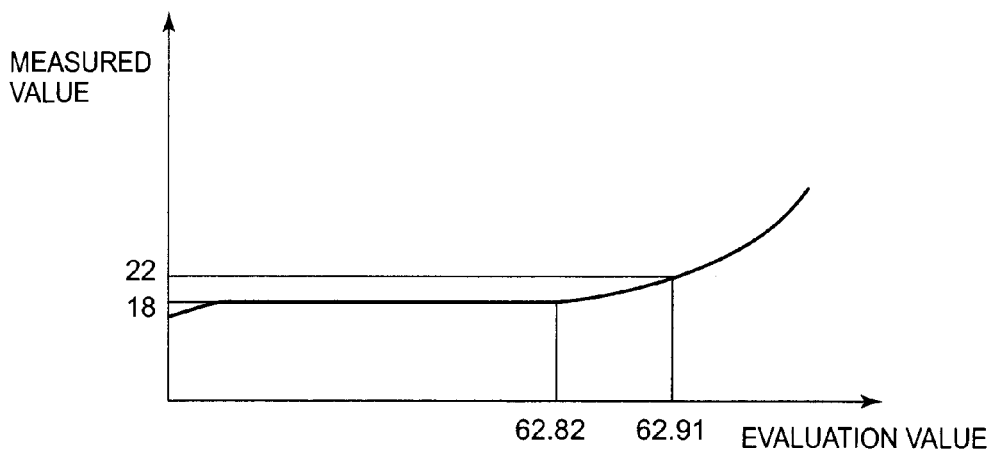
FIG. 7 is one example of a statistic curve in case of a test result having multiple values.

At S604, by using a statistic curve (FIG. 7), the recent evaluation value, and the evaluation value at the previous test timing, a difference between values (Hereinafter, it is called "a measurement value") of test results is calculated. In this case, the recent evaluation value is already calculated as 62.91, and the evaluation value at the previous test timing is already calculated as 62.82. Accordingly, as shown in FIG. 7, the difference between two corresponding measurement values is 4.

At S605, by referring to a correspondence table (table 3) representing relationship between a difference of measurement values and a probability of failure, the probability of failure is calculated. As shown in table 3, the probability of failure corresponding to the difference 4 is 0.01. When the probability of failure of all test items is calculated, processing is completed (S606). In above explanation, the evaluation value is calculated based on the date. However, if the usage status and the test result are measured several times per one day, the evaluation value may be calculated based on time.

The cost storage unit 10 stores a cost (given to the measurement target 1 when the test item is executed one time) and an acceptable cost of a device. The cost is previously given to each test item as numerical values, by considering a physical load (caused by the test) of the device, a time required for the test, and an occupation ratio of resources (such as a CPU and a memory) for the test. Furthermore, the acceptable cost represents an upper limit of cost given to the device. For example, in case of a computer, the acceptable cost can be given as numerical values, by considering specification (such as the CPU and the memory).

Based on the probability of failure (calculated by the probability calculation unit 6) and the cost (stored in the cost storage unit 10), the probability/cost data creation unit 11 corresponds the test number, the probability of failure and the cost, with each test item, and creates probability/cost data (table 4) of all test items. The probability/cost data is stored into the probability/cost data storage unit 12.

From the probability/cost data and the acceptable cost (stored in the cost storage unit 10), the test schedule creation unit 7 creates a test schedule to be executed this time. As mentioned-above, the test schedule represents a combination of test items to be executed.

Figure 8:
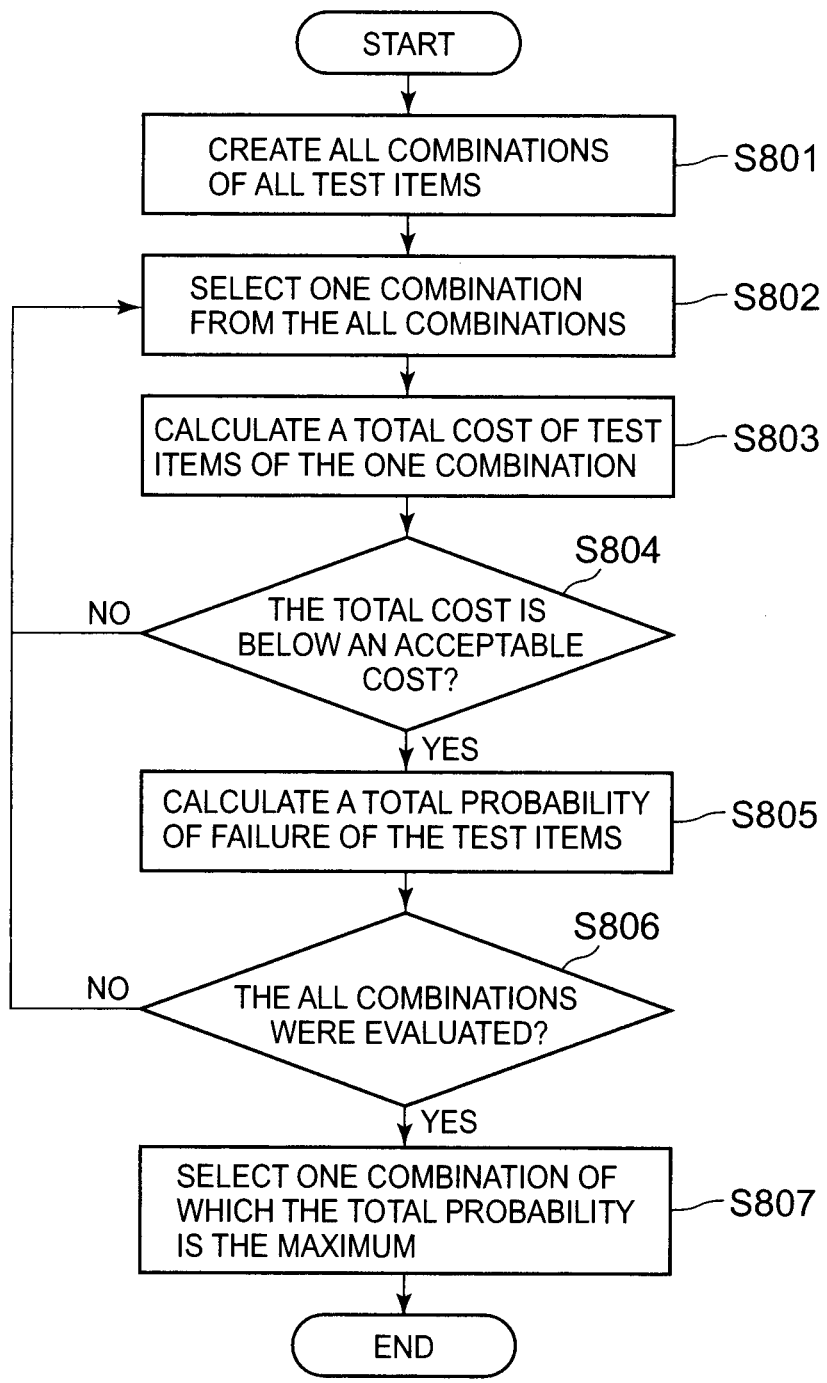
FIG. 8 is a flow chart to create a test schedule.

Hereinafter, processing to create the test schedule is explained by referring to a flow chart of FIG. 8. At S801, all patterns of combinations of all test items are created. At S802, one combination is selected from all patterns of combinations.

At S803, a total of cost of each test item included in the one combination is calculated. At S804, it is decided whether the total is below the acceptable cost.

As a result, if the total is not below the acceptable cost, a new combination is selected. If the total is below the acceptable cost, at S805, a total of probability of failure of each test item included in the one combination is calculated.

At S806, it is decided whether all patterns of combinations (created at S801) were evaluated. If at least one of all patterns is not evaluated yet, the at least one is selected. At S807, one combination of which the total of probability of failure is the maximum is selected as a test schedule to be executed this time.

In this case, at S801, all test items are set as a combination object. However, by setting only test items of which probability of failure is above a specific threshold as the combination object, all patterns of combinations of the test items may be created. Furthermore, at S805, if a plurality of combinations of which totals of probability of failure are equal exists, one combination of which total of costs is the minimum may be selected as the test schedule from the plurality of combinations.

After the test schedule is determined as mentioned-above, based on a test program (stored in the test program storage unit 4) to actually execute each test item, the test execution unit 8 executes the test item (Hereinafter, it is called "execution of test schedule") for each measurement target 1. Furthermore, at the same time, the test execution unit 8 controls the measurement unit 2 to measure the test item. While the test schedule is executed, a test result (measurement value) acquired by the measurement unit 2 is stored into the test result/usage status storage unit 5. In this case, the test result is displayed on the display unit 9.

Moreover, in the first embodiment, as mentioned-above, the probability calculation unit 6 calculates the probability of failure. However, the probability calculation unit 6 may calculate a probability of success, and the test schedule creation unit 7 may create a test schedule based on the probability of success.

TABLE 1

| | | MEASUREMENT DATE | | |
| --- | --- | --- | --- | --- |
| USAGE STATUS ITEM | . . . | 2010 Mar. 9 | 2010 Mar. 11 | 2010 Mar. 12 |
| ACCUMULATED TIME OF POWER-ON (HOUR) | . . . | 51.01 | 52.19 | 55.56 |
| ACCUMULATED QUANTITY OF CHARGE (AMPERE-HOUR) | . . . | 109.9 | 101.9 | 102.2 |
| ACCUMULATED FREQUENCY OF CONNECTOR-ON/OFF (THE NUMBER OF TIMES) | . . . | 21 | 23 | 23 |
| ACCUMULATED TIME OF HIGH TEMPERATURE (HOUR) | . . . | 9.8 | 9.8 | 9.9 |
| FREQUENCY OF HEAD-SAVE (THE NUMBER OF TIMES) | . . . | 10 | 11 | 12 |
| WRITE QUANTITY OF DATE (GB) | . . . | 32.2 | 35.7 | 36 |
| CPU OPERATION TIME | . . . | 5.1 | 5.1 | 5.5 |

TABLE 2

| TEST NUMBER | TEST ITEM | ... | TEST DATE | | |
|---|---|---|---|---|---|
| | | | 2010 Mar. 9 | 2010 Mar. 11 | 2010 Mar. 12 |
| 1 | CURRENT-CARRYING STATUS AT VIBRATION TIMING | ... | — | OK | — |
| 2 | HDD: EXECUTION TIME OF ATA COMMAND | ... | 100 | — | — |
| 3 | HDD: REPLY TIME OF ATA COMMAND | ... | 67 | — | — |
| 4 | ODD: EXECUTION TIME OF ATA COMMAND | ... | — | 160 | — |
| 5 | ODD: REPLY TIME OF ATA COMMAND | ... | — | 143 | — |
| 6 | PROCESSING SPEED OF ALU | ... | — | 120 | — |
| 7 | PROCESSING SPEED OF FPU | ... | — | 89 | — |
| 8 | TIP TEST OF CPU | ... | OK | — | — |
| 9 | TIP TEST OF GPU | ... | OK | — | — |
| 10 | MEMORY-SPEED | ... | 20 | — | — |
| 11 | BATTERY-CAPACITY | ... | 3.6 | — | — |
| 12 | ROTATION SPEED OF FAN · GAP OF CONTROL INSTRUCTION | ... | 0.01 | — | — |
| 13 | RECEIVING INTENSITY OF ANTENNA | ... | 100 | — | — |

TABLE 3

| DIFFERENCE | PROBABILITY OF FAILURE |
|---|---|
| 1~10 | 0.01 |
| 10~20 | 0.02 |
| 20~30 | 0.03 |
| ... | ... |

TABLE 4

| TEST NUMBER | PROBABILITY OF FAILURE | COST |
|---|---|---|
| 1 | 0.016 | 10 |
| 2 | 0.03 | 8 |
| 3 | 0.031 | 100 |
| ... | ... | ... |

The Second Embodiment

Figure 9:
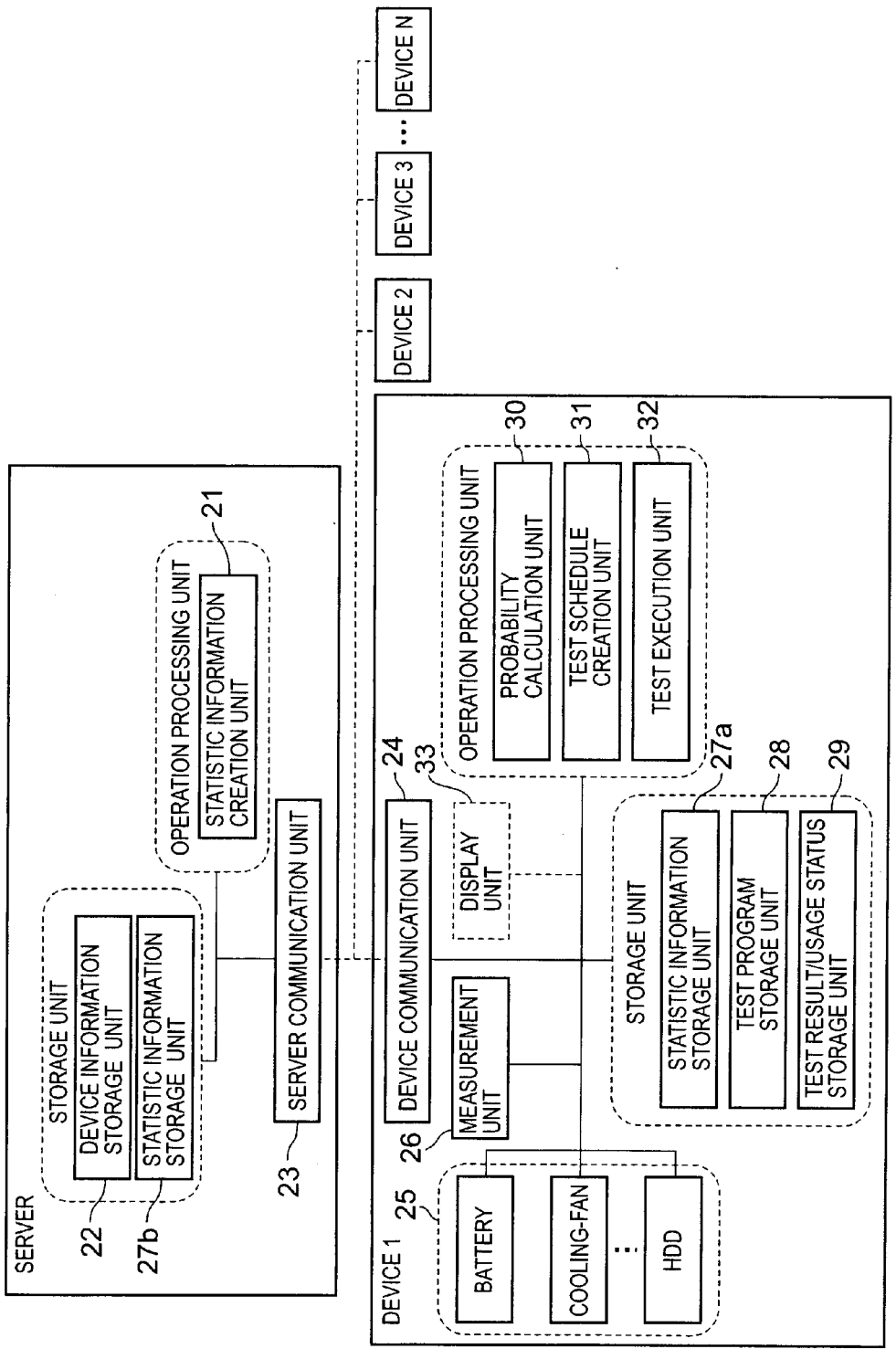
FIG. 9 is a block diagram of a maintenance system according to a second embodiment.

FIG. 9 is a block diagram of a maintenance system according to the second embodiment. As a feature different from the first embodiment, the maintenance system is separated into a device (terminal side) and a server. In the maintenance system of the second embodiment, the server includes a statistic information creation unit 21, a device information storage unit 22, and a server communication unit 23. The device includes a device communication unit 24, in addition to component of the electronic device of the first embodiment.

Figure 10:
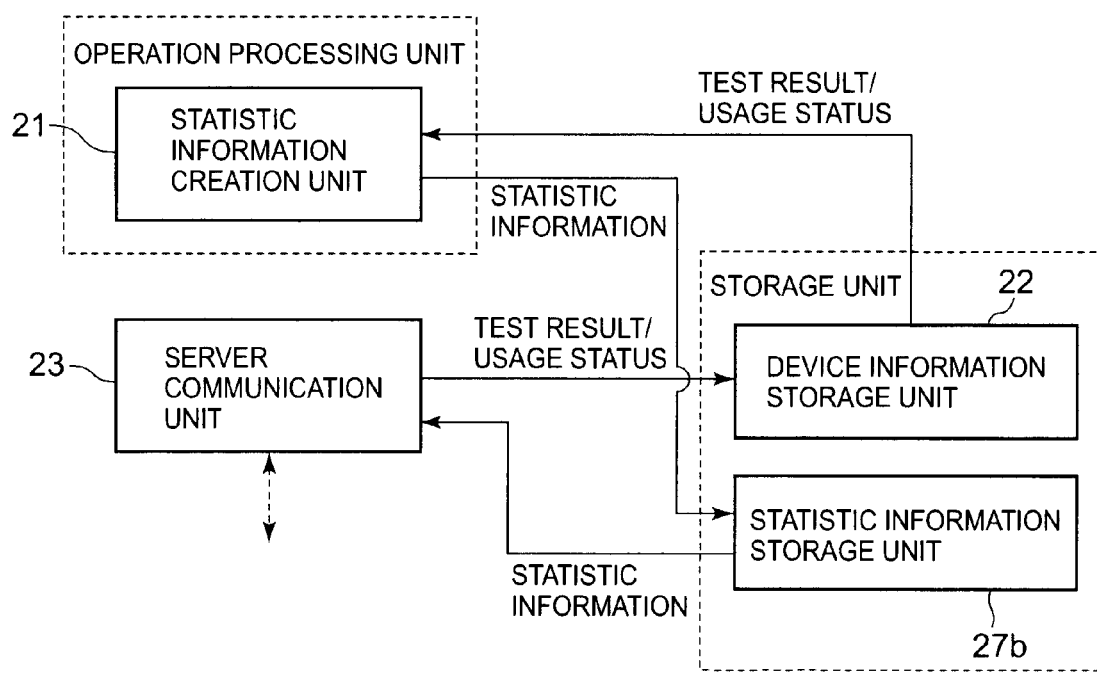
FIG. 10 is a block diagram of a server of the maintenance system in FIG. 9.

Hereinafter, by referring to a block diagram (FIG. 10) of the server in the maintenance system, operation of the server is explained.

Figure 11:
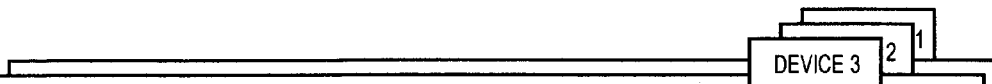
FIG. 11 is one example of usage status/test result data.

The server communication unit 23 receives usage status data and test result data from a plurality of devices. The device information storage unit 22 corresponds the usage status data and the test result data (received from each device) with a device number of the device, and stores them (the usage status, the test result data, the device number) in time series as shown in FIG. 11.

The statistic information creation unit 21 creates statistic information from the data stored in the device information storage unit 22. Hereinafter, processing flow to create statistic information by the statistic information creation unit 21 is explained.

The statistic information includes an equation to define an evaluation value, and a statistic curve to estimate a test result from the evaluation value. If the test result has multiple values, as mentioned-above, the statistic information includes a correspondence table representing relationship between a difference between measurement values and a probability of failure.

As to the second embodiment, statistic information is created based on data received from a plurality of devices. Moreover, in the statistic information, the equation to define the evaluation value and the correspondence table are previously determined for each test. In this case, processing in case of the test result having binary is different from processing in case of the test result having multiple values. Accordingly, processing of each case is explained by referring to a flow chart.

Figure 12:
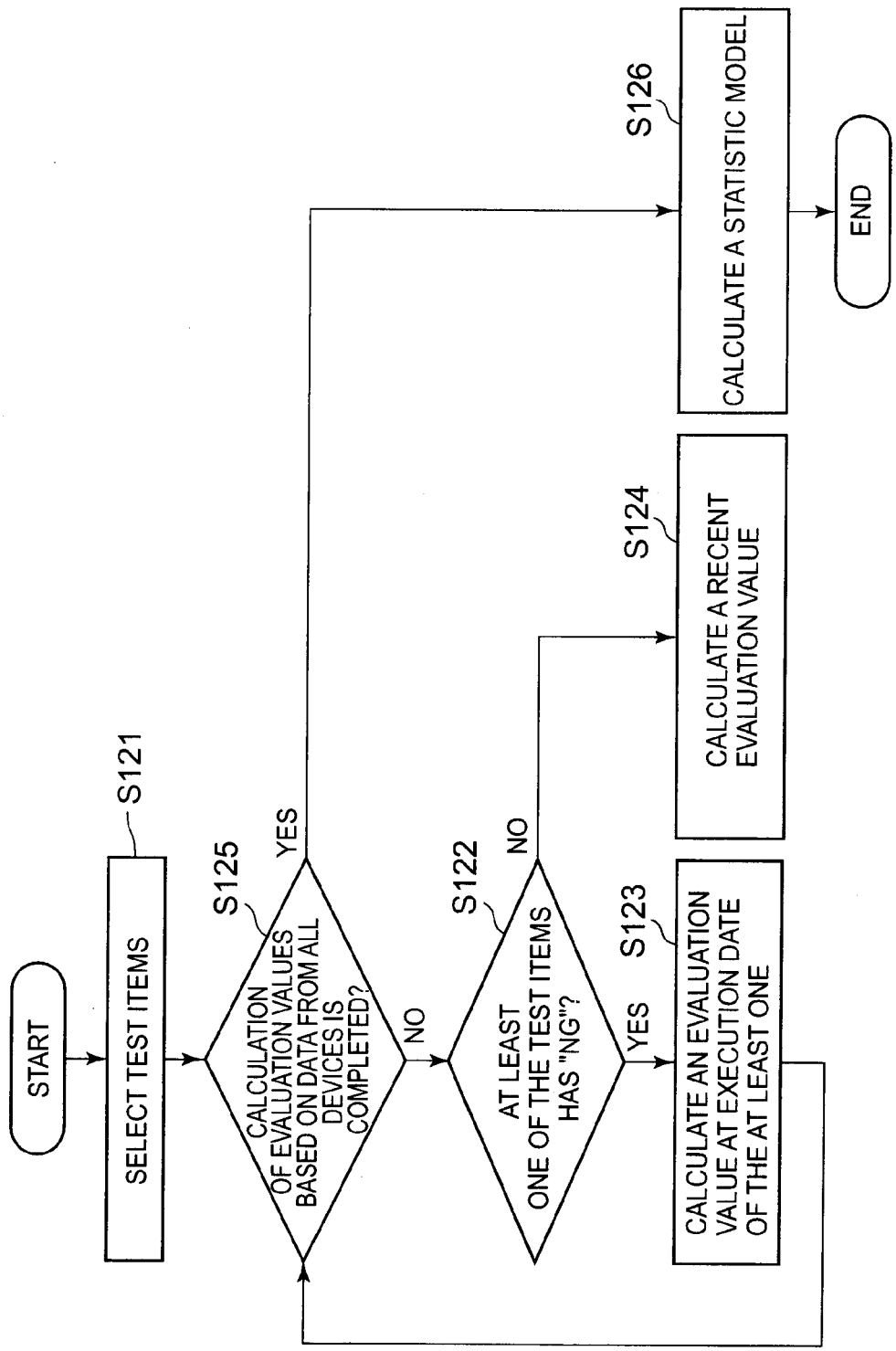
FIG. 12 is a flow chart to create statistic information in case of outputting a test result as binary.

FIG. 12 is a flow chart of creation-processing of statistic information in case of outputting the test result as binary. First, at S121, a test item to create statistic information is selected. At S122, among test results of the test item, it is decided whether "NG" exists in test results of the test item. If "NG" exists, at S123, a test date (execution date of the test item) when a test result is "NG" is extracted, and an evaluation value at the test date is calculated. Moreover, if a plurality of "NG" exists, the earliest date is selected from test dates of the test item, and an evaluation value at the earliest date is calculated.

As an example, a case to create statistic information of CPU-tip test is explained. By referring to test result data of table 5, as to CPU-tip test, a test result at 2010/3/9 is "NG". Next, in table 1, by referring to usage status data at a date (i.e., 2010/3/9) when the test result is "NG", parameter values necessary to calculate the evaluation value are acquired. In case of CPU-tip test, assume that the evaluation value is defined as the equation (1). In usage status data at 2010/3/9 of table 1, accumulated time of power-ON is 51.01 (hour), and CPU operation time is 5.1 (hour). By substituting these data for the equation (1), an evaluation value at the date (when the test result is NG) is calculated as 41.827.

Figure 5:
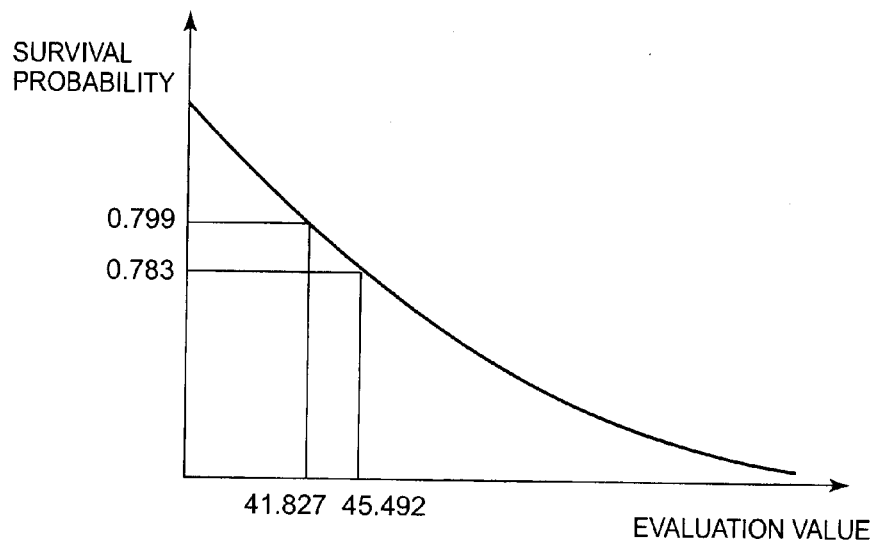
FIG. 5 is one example of a statistic curve in case of a test result having binary.

If "NG" does not exist in test result data, at S124, a recent evaluation value is calculated. A method for calculating the recent evaluation value is already explained in the first embodiment. Accordingly, explanation of this method is omitted. At S125, when calculation of evaluation values based on received data from all devices is completed, data of table 6 is created. At S126, by fitting the data of table 6 using a distribution function (For example, Weibull distribution), a statistic curve shown in FIG. 5 is created.

Figure 13:
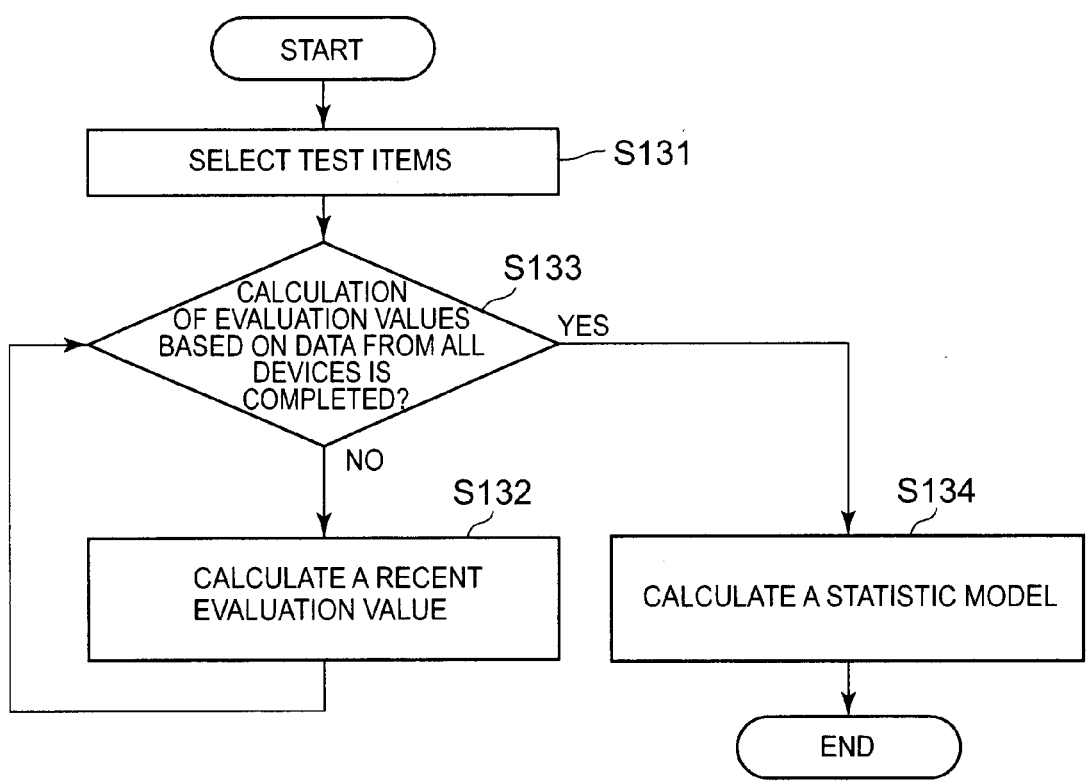
FIG. 13 is a flow chart to create statistic information in case of outputting a test result as multiple values.

FIG. 13 is a flow chart of creation-processing of statistic information in case of outputting the test result as multiple values. After a test item is selected at S131 as mentioned-above, at S132, parameter values of the test item at a recent test date are extracted from table 1, and an evaluation value is calculated based on the parameter values. At S133, when calculation of evaluation values based on received data from all devices is completed, data of table 7 is created. At S134, by fitting the data of table 7 using a statistic means (For example, a nonparametric regression), a statistic curve shown in FIG. 7 is created.

By using the statistic curve as mentioned-above, a test result (probability of failure) of the evaluation value can be estimated. Furthermore, actually, information of the statistic curve can be stored into the statistic information storage unit 27b prepared in the server, by formatting a pair of the evaluation value and the test result as a table.

Then, the statistic information (created by the statistic information creation unit 21 and stored into the statistic information storage unit 27b) is sent to a device by the server communication unit 23.

Figure 14:
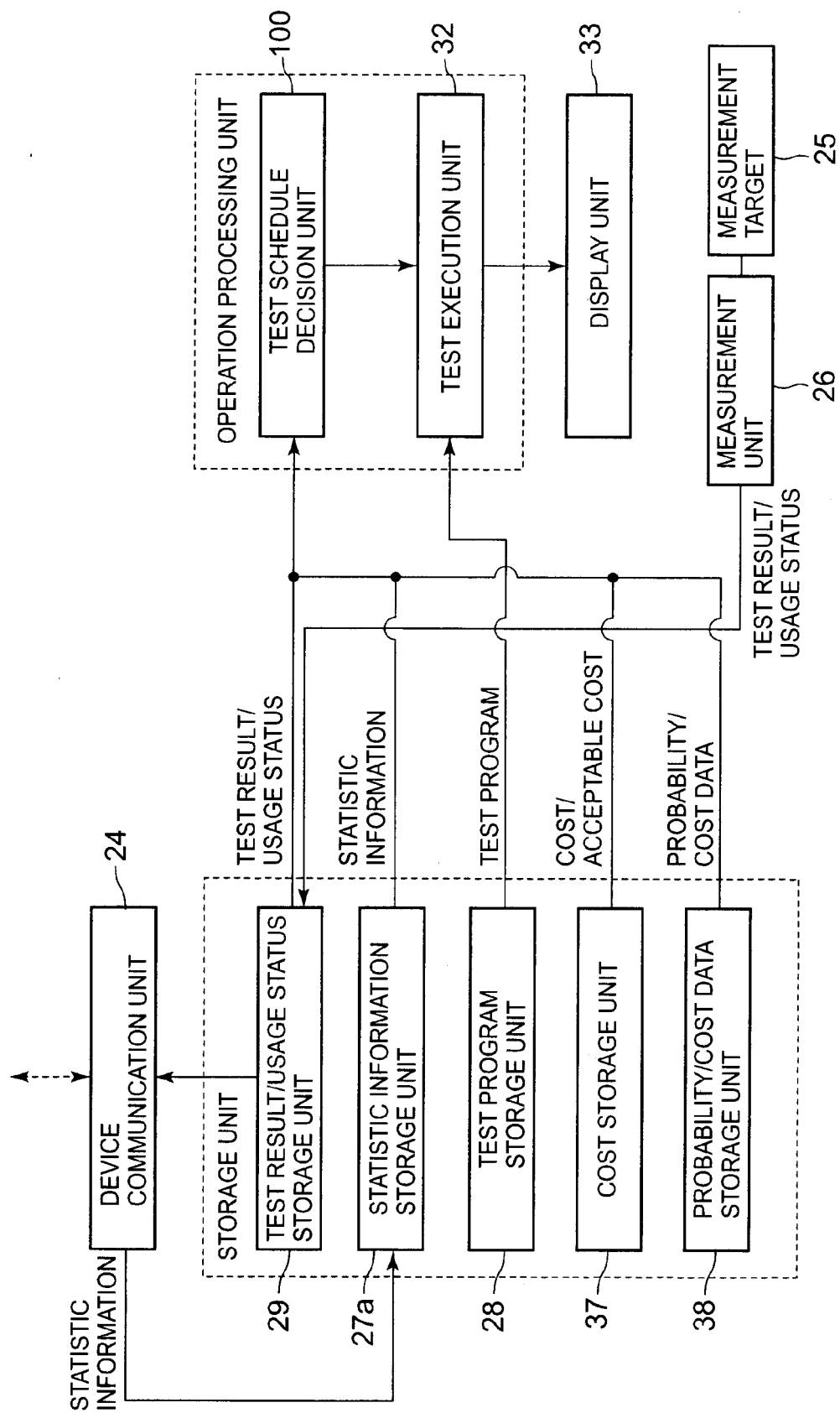
FIG. 14 is a block diagram of a device in the maintenance system in FIG. 9.

Hereinafter, in the maintenance system of the second embodiment, operation of the device is explained by referring to a block diagram of the device (FIG. 14). The device communication unit 24 receives the statistic information (sent from the server), and stores it into the statistic information storage unit 27a. In the same way as the first embodiment, the test schedule decision unit 100 determines a test schedule based on the statistic information, the usage status data, the test result data, the probability/cost data, and the acceptable cost.

As mentioned-above, after the test schedule decision unit 100 determines the test schedule, the test execution unit 32 executes the test schedule for each measurement target 25, based on a test program to execute the test schedule (previously stored in the test program storage unit 28). At the same time, the test execution unit 32 controls the measurement unit 26. During executing the test schedule, the measurement unit 26 measures a test result from each measurement target 25, and the test result is stored into the test result/usage status storage unit 29. In this case, the test result is displayed on the display unit 33. Furthermore, the usage status and the test result are sent to the server by the device communication unit 24.

Moreover, in above explanation, the server communication unit 23 and the device communication unit 24 have a function to receive/send respectively. However, these units may be composed as a transmission unit and receiving unit respectively.

TABLE 6

| EVALUATION VALUE | DECISION |
|---|---|
| 238 | NG |
| 122 | NG |
| 621 | OK |
| 229 | OK |
| 21 | OK |
| ... | ... |

TABLE 7

| EVALUATION VALUE | MEASURED VALUE |
|---|---|
| 293 | 115 |
| 62 | 23 |
| 760 | 444 |
| 322 | 101 |
| 36 | 12 |
| ... | ... |

The Third Embodiment

Figure 15:
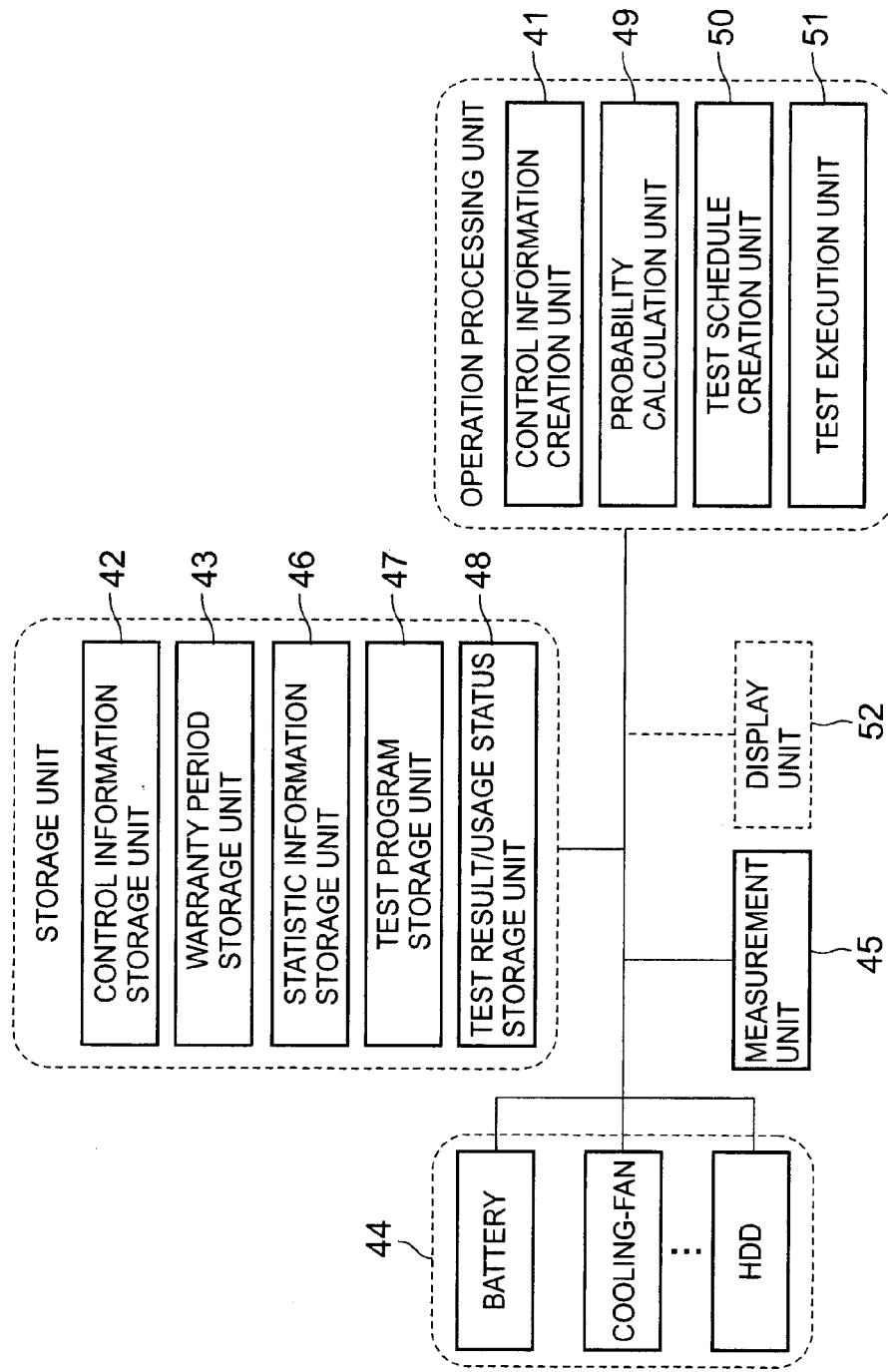
FIG. 15 is a block diagram of a maintenance system according to a third embodiment.

As specific feature of a maintenance system of the third embodiment, in addition to component of the first embodiment, as shown in FIG. 15, a control information creation unit 41 to create control information, a control information storage unit 42 to store the control information and a warranty period storage unit 43 to store a warranty period of the device are further equipped as shown in FIG. 15.

As mentioned-above, in the first and second embodiments, a test item is executed according to a test schedule created based on statistic information (by the test schedule creation unit 50). However, this method is not so effective for a status of the device. It is often effective that the test item is executed according to a test schedule created based on the status of the device.

Accordingly, in the third embodiment, the test execution unit 51 can execute a test schedule using control information to indicate the test schedule based on the status of the device. As the control information, as shown in table 8, a parameter value to mean content of a test schedule, and (if necessary) a test number included in the test schedule, are corresponded. In all cases except for a case that the parameter value of the control information is "0" (non-indication), the test execution

TABLE 5

| TEST | | | TEST DATE | | |
|---|---|---|---|---|---|
| NUMBER | TEST ITEM | ... | 2010 Mar. 9 | 2010 Mar. 11 | 2010 Mar. 12 |
| 1 | CURRENT-CARRYING STATUS AT VIBRATION TIMING | ... | — | OK | — |
| 2 | HDD: EXECUTION TIME OF ATA COMMAND | ... | 100 | — | — |
| 3 | HDD: REPLY TIME OF ATA COMMAND | ... | 67 | — | — |
| 4 | ODD: EXECUTION TIME OF ATA COMMAND | ... | — | 160 | — |
| 5 | ODD: REPLY TIME OF ATA COMMAND | ... | — | 143 | — |
| 6 | PROCESSING SPEED OF ALU | ... | — | 120 | — |
| 7 | PROCESSING SPEED OF FPU | ... | — | 89 | — |
| 8 | TIP TEST OF CPU | ... | NG | — | — |
| 9 | TIP TEST OF GPU | ... | OK | — | — |
| 10 | MEMORY-SPEED | ... | 20 | — | — |
| 11 | BATTERY-CAPACITY | ... | 3.6 | — | — |
| 12 | ROTATION SPEED OF FAN · GAP OF CONTROL INSTRUCTION | ... | 0.01 | — | — |
| 13 | RECEIVING INTENSITY OF ANTENNA | ... | 100 | — | — | unit 51 preferentially executes a test schedule according to the control information, than a test schedule created by the test schedule creation unit 50.

Hereinafter, operation of the maintenance system of the third embodiment is explained. In FIG. 15, the warranty period storage unit 43 stores a warranty period of the device.

In the third embodiment, based on a warranty period (warranty information) stored in the warranty period storage unit 43, when a predetermined day before (For example, one week before) the last date of the warranty period is coming soon, the control information creation unit 41 sets a parameter value of control information to "1" (execution of all test items). The control information is stored into the control information storage unit 42. In this case, the warranty period storage unit 43 stores the warranty period. However, the warranty period storage unit 43 may store a warranty limit.

The test schedule decision unit 100 (in FIG. 2) receives the control information from the control information storage unit 42, and determines a test schedule indicated by the control information.

In the same way as the first and second embodiments, after the test schedule decision unit 100 determines the test schedule as mentioned-above, the test execution unit 51 executes the test schedule for each measurement target 44, based on a test program to execute the test schedule (previously stored in the test program storage unit 47). At the same time, the test execution unit 51 controls the measurement unit 45. During executing the test schedule, the measurement unit 45 measures a test result from each measurement target 44, and the test result is stored into the test result/usage status storage unit 48. In this case, the test result is displayed on the display unit 52. Furthermore, the control information creation unit 41 updates the parameter value "1" (stored in the control information storage unit 42) to "0".

Furthermore, besides the case that the last date of the warranty period is coming, when a predetermined period has passed from a start date when the device is operated, by setting the parameter value to "2", test items having high occurrence ratio of abnormality can be only executed. Furthermore, by setting the parameter value to "3", for example, a test item of which object is a specific measurement target (such as a battery) can be only executed.

The third embodiment is explained according to the first embodiment. However, in the maintenance system having separately a server and a device as shown in the second embodiment, the third embodiment can be applied. In this case, a warranty period storage unit to store warranty period information of all devices is equipped in the server. Based on the warranty period information, a server communication unit can send control information of each device to the device.

TABLE 8

| PARAMETER VALUE | MEANING |
|---|---|
| 0 | NON-INDICATION |
| 1 | EXECUTION OF ALL TEST ITEMS |
| 2 | EXECUTION OF TEST ITEM OF WHICH OCCURRENCE RATIO OF ABNORMALITY IS ABOVE 0.001% |
| 3 | EXECUTION OF INDICATED TEST ITEM |

As to the maintenance system of at least one of the first, second and third embodiments, by considering a load of the device occurred by the diagnostics itself, a test schedule to effectively execute test items can be created.

While certain embodiments have been described, these embodiments have been presented by way of examples only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A maintenance system comprising:
a plurality of measurement targets;
a measurement unit configured to periodically measure a usage status of a measurement target, and to measure a test item of the measurement target at an arbitrary timing according to a test schedule having a plurality of test items, measured data of the test item being a test result;
a first storage unit configured to store the usage status and the test result in time series;
a second storage unit configured to store statistic information representing a relationship between the usage status and the test result;
a probability calculation unit configured to calculate a first evaluation value representing a load of the measurement target at a recent timing and a second evaluation value representing a load of the measurement target at the arbitrary timing, based on the usage status stored in the first storage unit, and to calculate a specific probability of each test item, based on the statistic information, the first evaluation value and the second evaluation value; and
a test schedule creation unit configured to create a new test schedule by selecting from the plurality of test items, based on the specific probability.

2. The system according to claim 1, further comprising:
a third storage unit configured to store a cost of each test item and an acceptable cost of the system, wherein
the specific probability is a probability of failure, and
the test schedule creation unit creates combinations of test items of which a total of the cost is below the acceptable cost, and selects one combination of which a total of the probability of failure is the maximum from the combinations, as the new test schedule.

3. The system according to claim 2, wherein
the test schedule creation unit selects test items each of which the probability of failure is above a specific threshold, and creates combinations of the test items of which a total of the cost is below the acceptable cost.

4. The system according to claim 1, further comprising:
a test execution unit configured to execute each test item of the new test schedule.

5. The system according to claim 4, further comprising:
a display unit configured to display the test result of each test item executed by the test execution unit.

6. The system according to claim 4, further comprising:
a fourth storage unit configured to store control information indicating a specifi test schedule, wherein
the test execution unit executes each test item of the specific test schedule.

7. The system according to claim 6, wherein
the control information indicates execution of all test items, or execution of test items each of which the probability of failure is above a specific threshold.

8. The system according to claim 6, further comprising:
a fifth storage unit configured to store warranty period information of the system, wherein
the test execution unit executes the specific test schedule when a last date of the warranty period information is coming within a specific period.

9. The system according to claim 1, further comprising:
a first communication unit configured to receive the statistic information from a server and
a second communication unit configured to send the usage status and the test result to the server, wherein
the second storage unit stores the statistic information received by the first communication unit.

10. A maintenance method comprising;
creating statistic information from a usage status and a test result, the statistic information representing a relationship between the usage status and the test result, the usage status being data periodically measured from a measurement target, the test result being data of each test item measured from the measurement target at an arbitrary timing;
calculating a first evaluation value representing a load of the measurement target at a recent timing and a second evaluation value representing a load of the measurement target at the arbitrary timing, based on the usage status;
calculating a specific probability of each test item, based on the statistic information, the first evaluation value and the second evaluation value; and
creating a test schedule by selecting from each test item, based on the specific probability.

* * * * *